United States Patent
Wang et al.

(10) Patent No.: US 9,299,585 B2
(45) Date of Patent: Mar. 29, 2016

(54) METHOD FOR CHEMICAL MECHANICAL POLISHING SUBSTRATES CONTAINING RUTHENIUM AND COPPER

(71) Applicant: Rohm and Haas Electronic Materials CMP Holdings, Inc., Newark, DE (US)

(72) Inventors: Hongyu Wang, Wilmington, DE (US); Lee Melbourne Cook, Atglen, PA (US); Jiun-Fang Wang, Hsinchu (TW); Ching-Hsun Chao, Hsinchu (TW)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 14/444,382

(22) Filed: Jul. 28, 2014

(65) Prior Publication Data

US 2016/0027663 A1 Jan. 28, 2016

(51) Int. Cl.

| | |
|---|---|
| *H01L 21/302* | (2006.01) |
| *H01L 21/321* | (2006.01) |
| *H01L 21/306* | (2006.01) |
| *B24B 1/00* | (2006.01) |
| *C09G 1/00* | (2006.01) |
| *C09G 1/02* | (2006.01) |
| *C09G 1/04* | (2006.01) |
| *C09K 13/06* | (2006.01) |
| *C09K 3/14* | (2006.01) |

(52) U.S. Cl.
CPC .............. *H01L 21/3212* (2013.01); *B24B 1/00* (2013.01); *C09G 1/00* (2013.01); *C09G 1/02* (2013.01); *C09G 1/04* (2013.01); *C09K 3/1454* (2013.01); *C09K 3/1463* (2013.01); *C09K 13/06* (2013.01); *H01L 21/30625* (2013.01)

(58) Field of Classification Search
None
See application file for complete search history.

(56) References Cited

U.S. PATENT DOCUMENTS

| | | | |
|---|---|---|---|
| 7,182,798 B2 | 2/2007 | Partch et al. | |
| 7,265,055 B2 | 9/2007 | Thompson et al. | |
| 7,384,871 B2 | 6/2008 | Kelley et al. | |
| 2006/0037942 A1 | 2/2006 | Yun et al. | |
| 2007/0181534 A1* | 8/2007 | Kamimura | B24B 37/044 216/88 |
| 2008/0105652 A1 | 5/2008 | Brusic et al. | |
| 2009/0124173 A1 | 5/2009 | Li | |
| 2011/0009033 A1* | 1/2011 | Tanaka | C09G 1/02 451/36 |
| 2011/0318928 A1 | 12/2011 | Bian | |
| 2012/0329279 A1 | 12/2012 | Shi | |
| 2013/0005149 A1 | 1/2013 | Li et al. | |

OTHER PUBLICATIONS

Peethala, et al., Ruthenium Polishing Using Potassium Periodate as the Oxidizer and Silica Abrasives, Journal of The Electrochemical Society, 158 (3) H271-H276 (2011).

* cited by examiner

*Primary Examiner* — Jiong-Ping Lu
(74) *Attorney, Agent, or Firm* — Thomas S. Deibert

(57) ABSTRACT

A method for chemical mechanical polishing of a substrate comprising ruthenium and copper is provided wherein the substrate is contacted with a polishing slurry containing an abrasive, hypochlorite, a copolymer of acrylic acid and methacrylic acid, benzotriazole, poly(methyl vinyl ether) and a non-ionic surfactant at a pH of 9 to 11.

10 Claims, No Drawings

METHOD FOR CHEMICAL MECHANICAL POLISHING SUBSTRATES CONTAINING RUTHENIUM AND COPPER

The present invention relates to a method for chemical mechanical polishing of a substrate comprising ruthenium and copper. More particularly, the present invention relates to a method for chemical mechanical polishing of a semiconductor substrate comprising ruthenium and copper.

As the line widths and layer thicknesses in semiconductor substrates continue to decrease, ruthenium is increasingly replacing the use of copper seed layers in various integration schemes. Moreover, increasing demands for high density integrated circuits, are driving device designs incorporating multiple overlying layers of metal interconnect structures. To facilitate such multilayer device designs, it is critical to planarize each device layer. Semiconductor manufactures rely on chemical mechanical polishing as a cost effective way to provide flat substrate surfaces.

Because integration schemes used by different semiconductor manufacturers vary, the rate selectivity required for various device layers polished in chemical mechanical polishing steps also varies. In addition, the chemical mechanical polishing byproducts present during a given polishing operation for a given device configuration may vary. For example, conventional polishing compositions designed for ruthenium polishing typically contain a strong oxidizing agent, have a low pH or have both a low pH and a strong oxidizing agent. Such formulations may provide useful ruthenium removal rates; however, they also provide the potential to form ruthenium tetraoxide. Ruthenium tetraoxide is a highly toxic gas, which required special precautions during chemical mechanical polishing operations.

In addition, copper oxidizes very quickly when exposed to polishing compositions containing strong oxidizing agents. Given the difference in the reduction potential of ruthenium and copper, copper may be subject to galvanic attack by ruthenium when polishing certain device configurations using conventional ruthenium polishing compositions. This may lead to differing removal rates of copper and ruthenium when polishing, resulting in undesirable non-uniformities.

One asserted solution for polishing ruthenium and copper containing substrate layers is disclosed by Li et al. in U.S. Patent Application Publication No. 2009/0124173. Li et al. disclose a chemical mechanical polishing composition comprising: (a) an abrasive, (b) an aqueous carrier, (c) an oxidizing agent having a standard reduction potential of greater than 0.7 V and less than 1.3 V relative to a standard hydrogen electrode, and (d) optionally a source of borate anions, with the proviso that when the oxidizing agent comprises a peroxide other than perborate, percarbonate, or perphosphate, the chemical mechanical polishing composition further comprises a source of borate anions, wherein the pH of the chemical mechanical polishing composition is between about 7 and about 12.

Notwithstanding, there is a continuing need for new chemical mechanical polishing slurry compositions and methods for use in polishing substrates having ruthenium and copper surface features.

The present invention provides a method for chemical mechanical polishing of a substrate, comprising: providing a polishing machine; providing a substrate, wherein the substrate comprises ruthenium and copper; providing a chemical mechanical polishing slurry composition comprising, as initial components: water; 0.1 to 25 wt % of an abrasive; 0.05 to 1 wt % of sodium hypochlorite or potassium hypochlorite; 0.001 to 1 wt % of a copolymer of acrylic acid and methacrylic acid; 0.005 to 1 wt % of a corrosion inhibitor for copper (preferably BTA); 0 to 0.01 wt % of a polymethylvinyl ether (PMVE); 0 to 0.1 wt % of a non-ionic surfactant; wherein the chemical mechanical polishing slurry composition has a pH 8 to 12; providing a chemical mechanical polishing pad; installing the chemical mechanical polishing pad and the substrate in the chemical mechanical polishing machine; creating dynamic contact between the chemical mechanical polishing pad and the substrate with a down force of 0.69 to 34.5 kPa; dispensing the chemical mechanical polishing slurry composition in proximity to an interface between the chemical mechanical polishing pad and the substrate; wherein the chemical mechanical polishing slurry composition comes into contact with ruthenium and copper of the substrate; wherein the substrate is polished; and, wherein some of the ruthenium is removed from the substrate.

The present invention provides a method for chemical mechanical polishing of a substrate, comprising: providing a polishing machine; providing a substrate, wherein the substrate comprises ruthenium and copper; providing a chemical mechanical polishing slurry composition comprising, as initial components: water; 5 to 15 wt % of the abrasive, wherein the abrasive is a colloidal silica abrasive having an average particle size of 1 to 100 nm; 0.05 to 1 wt % of sodium hypochlorite; 0.001 to 1 wt % of the copolymer of acrylic acid and methacrylic acid, wherein the copolymer of acrylic acid and methacrylic acid has an acrylic acid to methacrylic acid ratio of 1:5 to 5:1 and a weight average molecular weight of 10,000 to 50,000 g/mol; 0.005 to 1 wt % of the corrosion inhibitor for copper, wherein the corrosion inhibitor for copper is benzotriazole; 0.0005 to 0.005 wt % of the poly(methylvinyl ether), wherein the poly(methylvinyl ether) has a weight average molecular weight of 10,000 to 50,000 g/mol; 0.005 to 0.05 wt % of the non-ionic surfactant, wherein the non-ionic surfactant is a polyethylene glycol sorbitan monolaurate; wherein the chemical mechanical polishing slurry composition has a pH 9 to 11; providing a chemical mechanical polishing pad; installing the chemical mechanical polishing pad and the substrate in the chemical mechanical polishing machine; creating dynamic contact between the chemical mechanical polishing pad and the substrate with a down force of 0.69 to 34.5 kPa; dispensing the chemical mechanical polishing slurry composition in proximity to an interface between the chemical mechanical polishing pad and the substrate; wherein the chemical mechanical polishing slurry composition comes into contact with ruthenium and copper of the substrate; wherein the substrate is polished; and, wherein some of the ruthenium is removed from the substrate.

The present invention provides a method for chemical mechanical polishing of a substrate, comprising: providing a polishing machine; providing a substrate, wherein the substrate comprises ruthenium and copper; providing a chemical mechanical polishing slurry composition comprising, as initial components: water; 5 to 15 wt % of the abrasive, wherein the abrasive is a colloidal silica abrasive having an average particle size of 25 to 85 nm; 0.05 to 1 wt % of sodium hypochlorite; 0.001 to 1 wt % of the copolymer of acrylic acid and methacrylic acid, wherein the copolymer of acrylic acid and methacrylic acid has an acrylic acid to methacrylic acid ratio of 1:5 to 5:1 and a weight average molecular weight of 20,000 to 25,000 g/mol; 0.005 to 1 wt % of the corrosion inhibitor for copper, wherein the corrosion inhibitor for copper is benzotriazole; 0.0005 to 0.005 wt % of the poly(methylvinyl ether), wherein the poly(methylvinyl ether) has a weight average molecular weight of 25,000 to 40,000 g/mol; 0.005 to 0.05 wt % of the non-ionic surfactant, wherein the non-ionic surfactant is a polyethylene glycol sorbitan monolaurate; wherein the chemical mechanical polishing slurry composition has a pH 9 to 11; providing a chemical mechanical polishing pad; installing the chemical mechanical polishing pad and the substrate in the chemical mechanical polishing machine; creating dynamic contact between the chemical mechanical polishing pad and the substrate with a down force of 0.69 to 34.5 kPa; dispensing the chemical mechanical polishing slurry composition in proximity to an interface between the chemical mechanical polishing pad and the substrate; wherein the chemical mechanical polishing slurry composition comes into contact with ruthenium and copper of the substrate; wherein the substrate is polished; and, wherein some of the ruthenium is removed from the substrate.

The present invention provides a method for chemical mechanical polishing of a substrate, comprising: providing a polishing machine; providing a substrate, wherein the substrate comprises ruthenium and copper; providing a chemical mechanical polishing slurry composition comprising, as initial components: water; 7 to 12 wt % of the colloidal silica abrasive, wherein the colloidal silica abrasive has an average particle size of 25 to 85 nm; 0.07 to 1 wt % of sodium hypochlorite; 0.01 to 0.1 wt % of the copolymer of acrylic acid and methacrylic acid, wherein the copolymer of acrylic acid and methacrylic acid has an acrylic acid to methacrylic acid ratio of 1:5 to 5:1 and a weight average molecular weight of 15,000 to 30,000 g/mol; 0.03 to 0.05 wt % of the benzotriazole; 0.001 to 0.0025 wt % of the poly(methylvinyl ether), wherein the poly(methylvinyl ether) has a weight average molecular weight of 25,000 to 40,000 g/mol; 0.0075 to 0.015 wt % of the non-ionic surfactant, wherein the non-ionic surfactant is a polyethylene glycol sorbitan monolaurate; wherein the chemical mechanical polishing slurry composition has a pH 10 to 11; providing a chemical mechanical polishing pad; installing the chemical mechanical polishing pad and the substrate in the chemical mechanical polishing machine; creating dynamic contact between the chemical mechanical polishing pad and the substrate with a down force of 0.69 to 34.5 kPa; dispensing the chemical mechanical polishing slurry composition in proximity to an interface between the chemical mechanical polishing pad and the substrate; wherein the chemical mechanical polishing slurry composition comes into contact with ruthenium and copper of the substrate; wherein the substrate is polished; and, wherein some of the ruthenium is removed from the substrate.

The present invention provides a method for chemical mechanical polishing of a substrate, comprising: providing a polishing machine; providing a substrate, wherein the substrate comprises ruthenium and copper; providing a chemical mechanical polishing slurry composition comprising, as initial components: water; 7 to 12 wt % of the colloidal silica abrasive, wherein the colloidal silica abrasive has an average particle size of 25 to 85 nm; 0.075 to 0.5 wt % sodium hypochlorite; 0.05 to 0.075 wt % of the copolymer of acrylic acid and methacrylic acid, wherein the copolymer has an acrylic acid to methacrylic acid ratio 2:3 and a weight average molecular weight of 20,000 to 25,000 g/mol; 0.03 to 0.05 wt % of the benzotriazole; 0.001 to 0.0025 wt % of the poly(methylvinyl ether), wherein the poly(methylvinyl ether) has a weight average molecular weight of 25,000 to 40,000 g/mol; 0.0075 to 0.015 wt % of the non-ionic surfactant, wherein the non-ionic surfactant is a polyethylene glycol sorbitan monolaurate; wherein the chemical mechanical polishing slurry composition has a pH 10 to 11; providing a chemical mechanical polishing pad; installing the chemical mechanical polishing pad and the substrate in the chemical mechanical polishing machine; creating dynamic contact between the chemical mechanical polishing pad and the substrate with a down force of 0.69 to 34.5 kPa; dispensing the chemical mechanical polishing slurry composition in proximity to an interface between the chemical mechanical polishing pad and the substrate; wherein the chemical mechanical polishing slurry composition comes into contact with ruthenium and copper of the substrate; wherein the substrate is polished; and, wherein some of the ruthenium is removed from the substrate.

DETAILED DESCRIPTION

Many prospective chemical mechanical polishing compositions exhibiting a desirable ruthenium removal rate and ruthenium to copper selectivity as evinced by blanket layer polishing experiments fail to exhibit robust polishing performance for differing device configurations exhibited by various patterned substrates (i.e., substrates having both ruthenium and copper surface features). It is believed that byproducts produced during the chemical mechanical polishing of substrates comprising ruthenium and copper include copper ions. It is further believed that these copper ions lead to the decomposition of sodium hypochlorite oxidant. It has been surprisingly been found that the chemical mechanical polishing slurry composition containing sodium hypochlorite oxidant used in the method of the present invention exhibits robust polishing properties over a variety of different device configurations having both ruthenium and copper surface features.

The method for chemical mechanical polishing a substrate of the present invention is useful for chemical mechanical polishing a surface of a substrate comprising ruthenium and copper. The method for chemical mechanical polishing a surface of a substrate of the present invention is particularly useful for chemical mechanical polishing of a surface of a semiconductor wafer having ruthenium and copper surface features, wherein the chemical mechanical polishing slurry composition comes into contact with ruthenium and copper of the surface features; and, wherein some of the ruthenium is removed from the substrate.

Preferably, the water used as an initial component in the chemical mechanical polishing slurry composition used in the method for chemical mechanical polishing of the present invention is at least one of deionized and distilled to limit incidental impurities.

Abrasives suitable for use in the chemical mechanical polishing slurry composition used in the method for chemical mechanical polishing of the present invention include, for example, inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Modified forms of these inorganic oxides, such as, organic polymer-coated inorganic oxide particles and inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Preferably, the abrasive used is a colloidal silica abrasive. More preferably, the abrasive used is a colloidal silica having an average particle size of 1 to 100 nm (more preferably, 10 to 100 nm; most preferably, 25 to 85 nm) as determined by well known laser light scattering techniques.

The chemical mechanical polishing slurry composition used in the method for chemical mechanical polishing of the present invention preferably comprises, as an initial component, 0.1 to 25 wt % (preferably, 1 to 20 wt %; more preferably, 5 to 15 wt %; most preferably, 7 to 12 wt %) of an abrasive. Preferably, the abrasive is a colloidal silica abrasive. More preferably, the abrasive is a colloidal silica abrasive having an average particle size of 1 to 100 nm (more preferably, 10 to 100 nm; most preferably, 25 to 85 nm). Most preferably, the chemical mechanical polishing slurry composition of the present invention comprises, as an initial component, 5 to 15 wt % (more preferably, 7 to 12 wt %) of a colloidal silica abrasive having an average particle size of 10 to 100 nm (more preferably, 25 to 85 nm).

The chemical mechanical polishing slurry composition used in the method for chemical mechanical polishing of the present invention preferably comprises, as an initial component, 0.05 to 1 wt % (more preferably, 0.07 to 1 wt %; most preferably, 0.075 to 0.5 wt %) of at least one of sodium hypochlorite and potassium hypochlorite. More preferably, the chemical mechanical polishing slurry composition used in the method for chemical mechanical polishing of the present invention preferably comprises, as an initial component, 0.05 to 1 wt % (more preferably, 0.07 to 1 wt %; most preferably, 0.075 to 0.5) of sodium hypochlorite.

The chemical mechanical polishing slurry composition used in the method for chemical mechanical polishing of the present invention preferably comprises, as an initial component, 0.001 to 1 wt % (preferably, 0.0075 to 0.5 wt %; more preferably, 0.01 to 0.1 wt %; most preferably, 0.05 to 0.075 wt %) of at least one copolymer of acrylic acid and methacrylic acid. Preferably, the at least one copolymer of acrylic acid and methacrylic acid is selected from the group of acrylic acid and methacrylic acid copolymers having an acrylic acid to methacrylic acid ratio of 1:10 to 10:1 (more preferably, 1:5 to 5:1; most preferably, 2:3). Preferably, the at least one copolymer of acrylic acid and methacrylic acid is selected from the group of acrylic acid and methacrylic acid copolymers having a weight average molecular weight of 5,000 to 100,000 g/mol (more preferably, 10,000 to 50,000 g/mol; still more preferably, 15,000 to 30,000 g/mol; most preferably, 20,000 to 25,000 g/mol). Most preferably, the at least one copolymer of acrylic acid and methacrylic acid is selected from the group of acrylic acid and methacrylic acid copolymers having an acrylic acid to methacrylic acid ratio of 1:10 to 10:1 (more preferably, 1:5 to 5:1; most preferably, 2:3) and having a weight average molecular weight of 5,000 to 100,000 g/mol (more preferably, 10,000 to 50,000 g/mol; still more preferably, 15,000 to 30,000 g/mol; most preferably, 20,000 to 25,000 g/mol).

The chemical mechanical polishing slurry composition used in the method for chemical mechanical polishing of the present invention preferably comprises, as an initial component, 0.005 to 1 wt % (preferably, 0.0075 to 0.5 wt %; more preferably, 0.01 to 0.1 wt %; most preferably, 0.03 to 0.05 wt %) of a corrosion inhibitor for copper. Preferably, the corrosion inhibitor for copper is an azole inhibitor. More preferably, the corrosion inhibitor for copper is an azole inhibitor selected from the group consisting of benzotriazole (BTA), mercaptobenzothiazole (MBT), tolytriazole (TTA) and imidazole. Most preferably, the corrosion inhibitor for copper is benzotriazole.

The chemical mechanical polishing slurry composition used in the method for chemical mechanical polishing of the present invention optionally comprises, as an initial component, 0 to 0.01 wt % (preferably, 0.0005 to 0.005 wt %; most preferably, 0.0010 to 0.0025 wt %) of a poly(methyl vinyl ether) (PMVE). Preferably, the poly(methyl vinyl ether) in the chemical mechanical polishing slurry composition used in the method of the present invention has a weight average molecular weight of 5,000 to 100,000 g/mol (more preferably, 10,000 to 50,000 g/mol; most preferably, 25,000 to 40,000 g/mol).

The chemical mechanical polishing slurry composition used in the method for chemical mechanical polishing of the present invention optionally comprises, as an initial component, 0 to 0.1 wt % (preferably, 0.005 to 0.05 wt %; most preferably, 0.0075 to 0.015 wt %) of a non-ionic surfactant. Preferably, the non-ionic surfactant is a polyethylene glycol sorbitan monolaurate (e.g., Tween® 20 available through Sigma-Aldrich).

The chemical mechanical polishing slurry composition used in the method for chemical mechanical polishing of the present invention preferably has a pH of 8 to 12 (preferably, 9 to 11; more preferably, 9.5 to 11; most preferably, 10 to 11). The chemical mechanical polishing slurry composition used in the method for chemical mechanical polishing of the present invention optionally includes a pH adjusting agent. Preferably, the optional pH adjusting agent is selected from an inorganic acid or an inorganic base. Most preferably, the optional pH adjusting agent is selected from nitric acid, sulfuric acid, hydrochloric acid, phosphoric acid, potassium sulfate and potassium hydroxide.

The chemical mechanical polishing slurry composition used in the method for chemical mechanical polishing of the present invention is preferably peroxy oxidizer free. The term "per-oxy oxidizer" as used herein and in the appended claims means oxidizers selected from hydrogen peroxide, urea hydrogen peroxide, percarbonate salts, benzoyl peroxide, peracetic acid, sodium peroxide, di-tert-butyl peroxide, monopersulfate salts, dipersulfate salts, iron(III) compounds. The term "per-oxy oxidizer free" as used herein and in the appended claims means that the chemical mechanical polishing slurry composition contains <1 ppm per-oxy oxidizer. Preferably, the chemical mechanical polishing slurry composition used in the method of the present invention contains <the detectable limit for per-oxy oxidizers.

The chemical mechanical polishing slurry composition used in the method for chemical mechanical polishing of the present invention is preferably periodic acid free. The term "periodic acid free" as used herein and in the appended claims means that the chemical mechanical polishing slurry composition contains <1 ppm periodic acid and salts thereof Preferably, the chemical mechanical polishing slurry composition used in the method of the present invention contains <the detectable limit for periodic acid and salts thereof.

The chemical mechanical polishing slurry composition used in the method for chemical mechanical polishing of the present invention is preferably borate anion free. The term "borate anion free" as used herein and in the appended claims means that the chemical mechanical polishing slurry composition contains <1 ppm borate anions. Preferably, the chemical mechanical polishing slurry composition used in the method of the present invention contains <the detectable limit for borate anions.

The chemical mechanical polishing slurry composition used in the method for chemical mechanical polishing of the present invention is preferably perborate free. The term "perborate free" as used herein and in the appended claims means that the chemical mechanical polishing slurry composition contains <1 ppm perborate. Preferably, the chemical mechanical polishing slurry composition used in the method of the present invention contains <the detectable limit for perborate.

The chemical mechanical polishing slurry composition used in the method for chemical mechanical polishing of the present invention is preferably percarbonate free. The term "percarbonate free" as used herein and in the appended claims means that the chemical mechanical polishing slurry composition contains <1 ppm percarbonate. Preferably, the chemical mechanical polishing slurry composition used in the method of the present invention contains <the detectable limit for percarbonate.

The chemical mechanical polishing slurry composition used in the method for chemical mechanical polishing of the present invention is preferably perphosphate free. The term "perphosphate free" as used herein and in the appended claims means that the chemical mechanical polishing slurry composition contains <1 ppm perphosphate. Preferably, the chemical mechanical polishing slurry composition used in the method of the present invention contains <the detectable limit for perphosphate.

The chemical mechanical polishing slurry composition used in the method for chemical mechanical polishing of the present invention is preferably calcium ion free. The term "calcium ion free" as used herein and in the appended claims means that the chemical mechanical polishing slurry composition contains <0.1 ppm calcium ions. Preferably, the chemical mechanical polishing slurry composition used in the method of the present invention contains <the detectable limit for calcium ions.

The chemical mechanical polishing slurry composition used in the method for chemical mechanical polishing of the present invention is preferably magnesium ion free. The term "magnesium ion free" as used herein and in the appended claims means that the chemical mechanical polishing slurry composition contains <0.1 ppm magnesium ions. Preferably, the chemical mechanical polishing slurry composition used in the method of the present invention contains <the detectable limit for magnesium ions.

The chemical mechanical polishing slurry composition used in the method for chemical mechanical polishing of the present invention is preferably free of oxirane ring containing materials. The term "oxirane ring free" as used herein and in the appended claims means that the chemical mechanical polishing slurry composition contains <1 ppm oxirane ring containing materials (e.g., water soluble polymers containing oxirane rings and surfactants containing oxirane rings). Preferably, the chemical mechanical polishing slurry composition used in the method of the present invention contains <the detectable limit for oxirane ring containing materials.

The chemical mechanical polishing slurry composition used in the method for chemical mechanical polishing of the present invention is preferably amide group free. The term "amide group free" as used herein and in the appended claims means that the chemical mechanical polishing slurry composition contains <1 ppm amide group containing materials. Preferably, the chemical mechanical polishing slurry composition used in the method of the present invention contains <the detectable limit for amide group containing materials.

The chemical mechanical polishing slurry composition used in the method for chemical mechanical polishing of the present invention is preferably phosphonic acid free. The term "phosphonic acid free" as used herein and in the appended claims means that the chemical mechanical polishing slurry composition contains <1 ppm phosphonic acid. Preferably, the chemical mechanical polishing slurry composition used in the method of the present invention contains <the detectable limit for phosphonic acid.

The chemical mechanical polishing slurry composition used in the method for chemical mechanical polishing of the present invention is preferably cyanate salt free. The term "cyanate salt free" as used herein and in the appended claims means that the chemical mechanical polishing slurry composition contains <1 ppm cyanate salt. Preferably, the chemical mechanical polishing slurry composition used in the method of the present invention contains <the detectable limit for periodic acid.

The chemical mechanical polishing slurry composition used in the method for chemical mechanical polishing of the present invention is preferably water soluble cellulose modified with carboxylic acid functionality free. The term "water soluble cellulose modified with carboxylic acid functionality free" as used herein and in the appended claims means that the chemical mechanical polishing slurry composition contains <1 ppm of water soluble cellulose modified with carboxylic acid functionality. Preferably, the chemical mechanical polishing slurry composition used in the method of the present invention contains <the detectable limit for water soluble cellulose modified with carboxylic acid functionality.

The chemical mechanical polishing pad used in the chemical mechanical polishing method of the present invention can by any suitable polishing pad known in the art. The chemical mechanical polishing pad may preferably be selected from woven and non-woven polishing pads. The chemical mechanical polishing pad can be made of any suitable polymer of varying density, hardness, thickness, compressibility and modulus. The chemical mechanical polishing pad can be grooved and perforated as desired.

Preferably, in the chemical mechanical polishing method of the present invention, the chemical mechanical polishing slurry composition is dispensed onto the polishing surface of the chemical mechanical polishing pad at or near the interface between the chemical mechanical polishing pad and the substrate.

Some embodiments of the present invention will now be described in detail in the following Examples.

Comparative Example A and Examples 1-4

Chemical Mechanical Polishing Slurry Compositions

The chemical mechanical polishing slurry compositions tested are described in TABLE 1. The chemical mechanical polishing slurry composition A is a comparative formulation, which is not within the scope of the claimed invention. The chemical mechanical polishing slurry compositions were adjusted to the pH noted in TABLE 1 using potassium hydroxide (KOH).

TABLE 1

| Ex. | Abrasive A[ε] (wt %) | Abrasive B[χ] (wt %) | PMVE[Φ] (wt %) | Surf[λ] (wt %) | Co-Poly[γ] (wt %) | BTA (wt %) | NaOCl (wt %) | pH |
|---|---|---|---|---|---|---|---|---|
| A | 5 | — | — | — | — | 0.02 | 0.5 | 10.5 |
| 1 | — | 9 | 0.0015 | 0.01 | 0.06 | 0.04 | 0.075 | 10.5 |

TABLE 1-continued

| Ex. | Abrasive A† (wt %) | Abrasive B^X (wt %) | PMVE^Φ (wt %) | Surf^λ (wt %) | Co-Poly^γ (wt %) | BTA (wt %) | NaOCl (wt %) | pH |
|---|---|---|---|---|---|---|---|---|
| 2 | — | 9 | 0.0015 | 0.01 | 0.06 | 0.04 | 0.15 | 10.5 |
| 3 | — | 9 | 0.0015 | 0.01 | 0.06 | 0.04 | 0.3 | 10.5 |
| 4 | — | 9 | 0.0015 | 0.01 | 0.06 | 0.04 | 0.5 | 10.5 |

†Klebosol ® K1630 colloidal silica having an average particle size of 120 nm manufactured by AZ Electronic Materials and commercially available from Rohm and Haas Electronic Materials CMP Inc.
^XKlebosol ® II 1501-50 colloidal silica having an average particle size of 50 nm manufactured by AZ Electronic Materials and commercially available from Rohm and Haas Electronic Materials CMP Inc.
^ΦPoly(methyl vinyl ether) having a weight average molecular weight of 32,000 g/mol
^λTween ® 20 non-ionic polyethylene glycol sorbitan monolaurate surfactant available from Sigma-Aldrich
^γCopolymer of acrylic acid and methacrylic acid monomers having a weight average molecular weight of 22,000 g/mol and an acrylic acid to methacrylic acid mole ratio of 2:3.

Polishing Tests

Polishing experiments were performed on copper (Cu), tetraethylorthosilicate (TEOS), Black Diamond® SiCOH film (BD) and physical vapor deposited Ruthenium ($Ru_{PVD}$) blanket wafers using the chemical mechanical polishing slurry compositions (CMPCs) described in TABLE 1. The polishing experiments were performed using an Applied Materials, Inc. Reflexion LK® 300 mm polishing machine equipped with an ISRM detector system using a VisionPad™ VP3100 polyurethane polishing pad with an SP2310 subpad and a 1010 groove pattern (commercially available from Rohm and Haas Electronic Materials CMP Inc.) under a 1 psi (6.89 kPa) down force, a chemical mechanical polishing slurry composition flow rate of 300 ml/min, a platen speed of 93 rpm and a carrier speed of 87 rpm. A Kinik® 32P-3FN diamond pad conditioner (commercially available from Kinik Company) was used to condition the polishing pad. The polishing pad was broken in with the conditioner using a down force of 7.0 lbs (3.18 kg) for 20 minutes. The polishing pad was further conditioned in situ during polishing at 10 sweeps/min from 2.0 to 13.7 inches from the center of the polishing pad with a down force of 6 lbs (2.72 kg). The Cu and $Ru_{PVD}$ removal rates reported in TABLE 2 was determined using a Jordan Valley JVX-5200T metrology tool. The TEOS and BD removal rates reported in TABLE 2 were determined by measuring the film thickness before and after polishing using a KLA-Tencor FX200 metrology tool. The results of the polishing tests are presented in TABLE 2.

TABLE 2

| CMPC Ex. | Cu RR (Å/min) | TEOS RR (Å/min) | BD RR (Å/min) | $Ru_{PVD}$ RR (Å/min) |
|---|---|---|---|---|
| A | 111 | 496 | 702 | 717 |
| 1 | 60 | 276 | 299 | 72 |
| 2 | 73 | 369 | 339 | 248 |
| 3 | 91 | 316 | 403 | 481 |
| 4 | 94 | 279 | 386 | 739 |

We claim:
1. A method for chemical mechanical polishing of a substrate, comprising:
 providing a polishing machine;
 providing a substrate, wherein the substrate comprises ruthenium and copper;
 providing a chemical mechanical polishing slurry composition comprising, as initial components:
 water;
 5 to 15 wt % of an abrasive, wherein the abrasive is a colloidal silica abrasive having an average particle size of 1 to 100 nm;
 0.05 to 1 wt % of sodium hypochlorite or potassium hypochlorite;
 0.001 to 1 wt % of a copolymer of acrylic acid and methacrylic acid, wherein the copolymer of acrylic acid and methacrylic acid has an acrylic acid to methacrylic acid ratio of 1:5 to 5:1 and a weight average molecular weight of 10,000 to 50,000 g/mol;
 0.005 to 1 wt % of a corrosion inhibitor for copper, wherein the corrosion inhibitor for copper is benzotriazole;
 0.0005 to 0.005 wt % of the poly(methylvinyl ether), wherein the poly(methylvinyl ether) has a weight average molecular weight of 10,000 to 50,000 g/mol;
 0.005 to 0.05 wt % of a non-ionic surfactant, wherein the non-ionic surfactant is a polyethylene glycol sorbitan monolaurate;
 wherein the chemical mechanical polishing slurry composition has a pH 8 to 12;
 providing a chemical mechanical polishing pad;
 installing the chemical mechanical polishing pad and the substrate in the chemical mechanical polishing machine;
 creating dynamic contact between the chemical mechanical polishing pad and the substrate with a down force of 0.69 to 34.5 kPa;
 dispensing the chemical mechanical polishing slurry composition in proximity to an interface between the chemical mechanical polishing pad and the substrate;
 wherein the chemical mechanical polishing slurry composition comes into contact with ruthenium and copper of the substrate; wherein the substrate is polished; and, wherein some of the ruthenium is removed from the substrate.

2. The method of claim 1, wherein the chemical mechanical polishing slurry composition has a pH 9 to 11.

3. The method of claim 2, wherein the colloidal silica abrasive has an average particle size of 25 to 85 nm.

4. The method of claim 2, wherein the copolymer of acrylic acid and methacrylic acid has a weight average molecular weight of 20,000 to 25,000 g/mol.

5. The method of claim 2, wherein the polymethylvinyl ether has a weight average molecular weight of 25,000 to 40,000 g/mol.

6. The method of claim 2, wherein the colloidal silica abrasive has an average particle size of 25 to 85 nm; wherein the copolymer of acrylic acid and methacrylic acid has a weight average molecular weight of 20,000 to 25,000 g/mol; and, wherein the polymethylvinyl ether has a weight average molecular weight of 25,000 to 40,000 g/mol.

7. The method of claim 2, wherein the chemical mechanical polishing slurry composition comprises, as initial components:

water;
7 to 12 wt % of the colloidal silica abrasive, wherein the colloidal silica abrasive has an average particle size of 25 to 85 nm;
0.07 to 1 wt % of sodium hypochlorite;
0.01 to 0.1 wt % of the copolymer of acrylic acid and methacrylic acid, wherein the copolymer of acrylic acid and methacrylic acid has an acrylic acid to methacrylic acid ratio of 1:5 to 5:1 and a weight average molecular weight of 15,000 to 30,000 g/mol;
0.03 to 0.05 wt % of the benzotriazole;
0.001 to 0.0025 wt % of the poly(methylvinyl ether), wherein the poly(methylvinyl ether) has a weight average molecular weight of 25,000 to 40,000 g/mol;
0.0075 to 0.015 wt % of the non-ionic surfactant, wherein the non-ionic surfactant is a polyethylene glycol sorbitan monolaurate;
wherein the chemical mechanical polishing slurry composition has a pH 10 to 11.

8. The method of claim 7, wherein the chemical mechanical polishing slurry composition comprises, as an initial component: 0.075 to 0.5 wt % sodium hypochlorite.

9. The method of claim 7, wherein the chemical mechanical polishing slurry composition comprises, as an initial component: 0.05 to 0.075 wt % of the copolymer of polyacrylic acid and methacrylic acid, wherein the copolymer has an acrylic acid to methacrylic acid ratio 2:3 and a weight average molecular weight of 20,000 to 25,000 g/mol.

10. The method of claim 7, wherein the chemical mechanical polishing slurry composition comprises, as an initial component: 0.075 to 0.5 wt % sodium hypochlorite; and, 0.05 to 0.075 wt % of the copolymer of polyacrylic acid and methacrylic acid, wherein the copolymer has an acrylic acid to methacrylic acid ratio 2:3 and a weight average molecular weight of 20,000 to 25,000 g/mol.

* * * * *